United States Patent [19]

McDougall et al.

[11] Patent Number: 5,162,768
[45] Date of Patent: Nov. 10, 1992

[54] MAGNETIC FIELD GENERATING ASSEMBLY

[75] Inventors: Ian L. McDougall; Alan G. A. M. Armstrong; Michael C. Begg; Donald Longmore, all of Oxon, England

[73] Assignee: Oxford Medical Limited, Oxford, England

[21] Appl. No.: 678,989

[22] PCT Filed: Oct. 31, 1989

[86] PCT No.: PCT/GB89/01296
  § 371 Date: Jun. 25, 1991
  § 102(e) Date: Jun. 25, 1991

[87] PCT Pub. No.: WO90/05369
  PCT Pub. Date: May 17, 1990

[30] Foreign Application Priority Data

Nov. 1, 1988 [GB] United Kingdom ............. 8825529

[51] Int. Cl.⁵ .................... G01V 3/00; H01F 1/00; H01F 3/00; H01F 7/00
[52] U.S. Cl. ..................................... 335/296; 324/318
[58] Field of Search .................. 335/296–301, 335/302–306, 216, 214, 210; 324/318–320; 250/395 ML; 315/5.34, 5.35; 310/11

[56] References Cited

U.S. PATENT DOCUMENTS 4,647,887  3/1987  Leupold .

FOREIGN PATENT DOCUMENTS 0160350 11/1985  European Pat. Off. .
0161782 11/1985  European Pat. Off. .
0187691  7/1986  European Pat. Off. .
2174248 10/1986  United Kingdom .

Primary Examiner—Gerald P. Tolin
Assistant Examiner—Raymond Barrera

[57] ABSTRACT

A magnetic field generating assembly comprises at least two counter-running, nested coils (31–33) positioned between and spaced from opposed pole pieces (42, 43). The pole pieces (42, 43) are mounted to a wall of iron (38–41) surrounding the coils, the walls providing a substantially closed magnetic flux path. The arrangement is such that forces on the coils (31–33) due to magnetic flux in the wall are substantially balanced. The gap between the coils (31–33) and at least one of the pole pieces (42, 43) is sufficient to accommodate a human body. The opposed pole pieces (42, 43) are nonplanar so that when working currents flow in the coils (31–33) a magnetic field is generated in working regions (48, 49) situated in the gap between the coils and the pole pieces having homogeneities suitable for performing a nuclear magnetic resonance experiment.

17 Claims, 5 Drawing Sheets

MAGNETIC FIELD GENERATING ASSEMBLY

The invention relates to a magnetic field generating assembly.

A wide variety of magnetic field generating assemblies have been designed in the past for use in different applications, all of which require the generation of a magnetic field in a working volume within which tasks are to be performed. Examples of such applications include magnetic resonance imaging (MRI) and nuclear magnetic resonance spectroscopy. These particular applications are complicated further by the fact that in order to achieve the high field strength required, superconducting magnets must be used with the consequent need for bulky cryogenic equipment and the like. In the past, the working volume has been provided within the bore of a superconducting coil although more recently certain proposals have been made for projecting at least a homogeneous region of the magnetic field outwardly of the bore to increase the ease of access. However, these constructions are still bulky and expensive.

GB-A-2174248 described a magnetohydrodynamic device. This is, however, unsuitable for performing a nuclear magnetic resonance experiment on the human body.

In accordance with the present invention, the magnetic field generating assembly comprises a magnetic field generator positioned between and spaced from opposed pole pieces which are mounted in a wall of magnetic material surrounding the magnetic field generator, the wall providing a substantially closed magnetic flux path, and the arrangement being such that forces on the generator due to magnetic flux in the wall are substantially balanced, characterized in that the magnetic field generator comprises at least two counter-running, nested coils; in that the gap between the magnetic filed generator and at least one of the pole pieces is sufficient to accommodate a human body; and in that the opposed pole pieces are non-planar, the arrangement being such that when working currents flow in the coils a magnetic field is generated in a working region situated in the gap between the magnetic field generator and the at least one pole piece having a homogeneity suitable for performing a nuclear magnetic resonance experiment.

This design leads to a new concept in magnetic field generating assemblies since by causing the wall of magnetic material to have a significant influence, a single, short magnetic field generator can be used to provide a source of magnetomotive force leading to the use of a very cheap cryostat. Furthermore, the net force on the cryostat will be substantially zero due to the balancing affect of the wall. In addition, the wall provides magnetic shielding externally of the assembly.

Preferably, the balancing of forces is achieved by constructing the assembly in a symmetrical form with the magnetic field generator symmetrically positioned within the wall. Alternatively, it may be possible to achieve the same balancing affect with a non-symmetrical arrangement by creating a pseudo-pole on one side of the generator relatively closer to the generator than the other pole.

Typically, the wall will be made from iron or some other ferro-magnetic material.

In some arrangements, the homogeneity of the magnetic field in the working region between the magnetic field generator and at least one of the pole pieces will be sufficient for the purpose to which the assembly is to be put. The homogeneity can be controlled during the design of the assembly by considering the effect of the wall and the magnetic field generator together using finite element methods. In particular, the wall itself may be contoured to achieve homogeneity within the working region. For example, the wall is preferably rectangular or square with the magnetic field generator placed substantially parallel with opposed sides of the wall. In this case, preferably the internal surfaces of the sides of the wall extending from the generator to the opposed walls taper towards the generator. In some cases, however, the homogeneity produced by the generator and wall alone may not be high enough in which case additional magnetic shims could be provided. Such shims could comprise shaped iron, permanent magnets or coils either on the wall or within the generator.

One major advantage of this system when applied to MRI is that the space between the magnetic field generator and the at least one pole piece is sufficiently large to allow a human patient to sit or stand within the space thus considerably reducing the claustrophobic feeling which a patient presently suffers when inserted in to the bore of a coil. Indeed it is envisaged that a patient could be sufficiently free to move in the working region as to exercise in cardiac studies. Furthermore, where the generator is symmetrically positioned between the two pole pieces, a pair of homogeneous working regions can be provided on each side of the generator allowing, in the case of MRI, two patients to be processed at once.

The pole pieces may be defined by parts of the wall itself or by additional elements mounted to the wall. Typically they are contoured so as to present a generally planar central face to the magnetic field generator but with a circular recess substantially coaxial with the coils positioned radially outwardly of the central face.

Examples of a magnet assembly for MRI in accordance with the present invention will now be described with reference to the accompanying drawings, in which.

Figure 1:
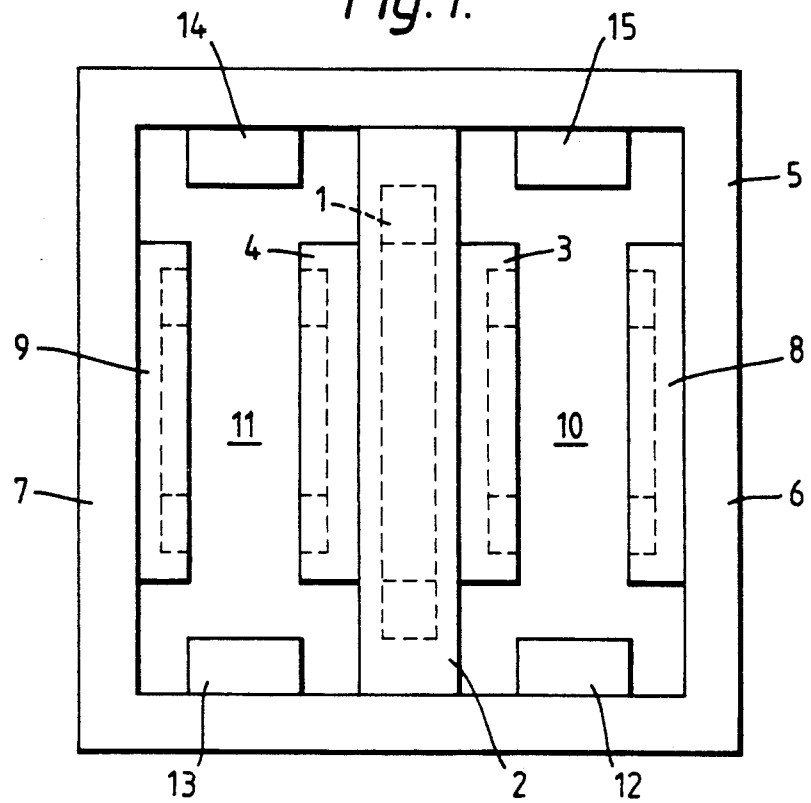
FIG. 1 is a side elevation of one example of the assembly.

The assembly shown in FIG. 1 comprises a pair of nested, counter-running coils 1 of superconducting wire mounted within a cryostat 2. Facing axially outwardly from the cryostat 2 are a pair of shaped, iron pole pieces 3, 4. The cryostat 2 is mounted within an open sided box of iron defined by a substantially square, iron wall 5. The coils 1 are arranged with their axes orthogonal to opposed end sections 6, 7 of the wall 5, the sections 6, 7 carrying respective shaped iron pole pieces 8, 9 coaxial with the coils 1.

Figure 2:
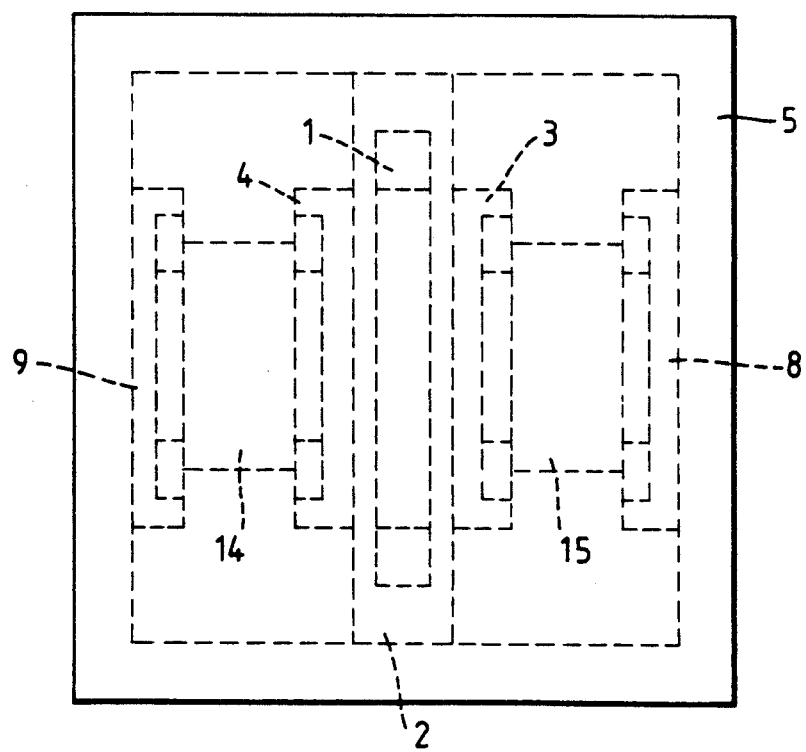
FIG. 2 is a plan of the FIG. 1 assembly.
Figure 3:
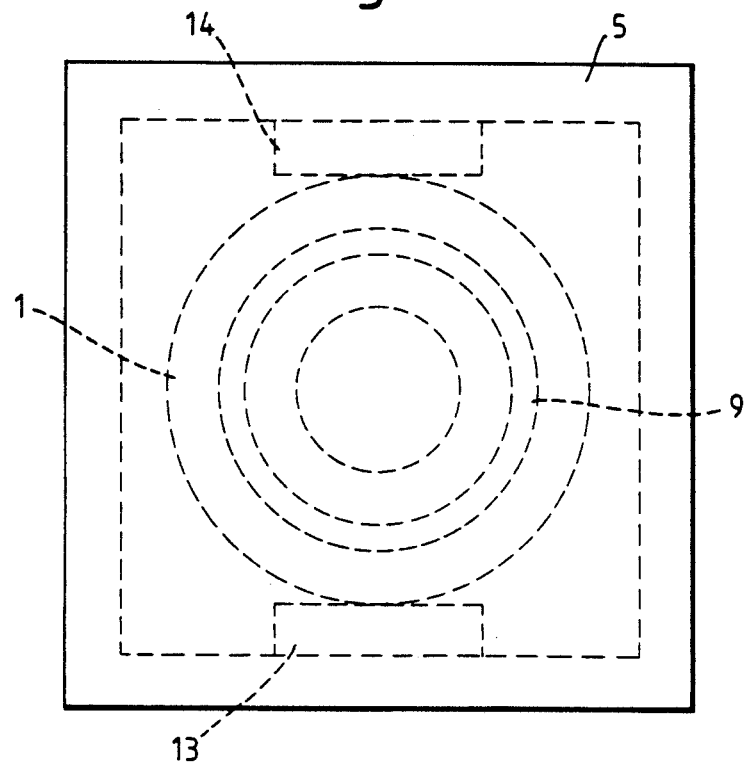
FIG. 3 is an end elevation of the FIG. 1 assembly.

In the past, where a magnet assembly suitable for MRI was required, coils having a relatively short axial length, as shown in FIGS. 1 and 2, would not be appropriate due to the considerable inhomogeneities in the magnetic field which such a coil would produce. This has been overcome at least partly by providing the iron wall 5 which, due to the magnetic flux which passes through the wall, contributes to the magnetic field in the regions 10, 11 defined between the opposed pairs of pole pieces 3, 8 and 4, 9 respectively. However, in general the degree of homogeneity achieved is still not sufficient for MRI and additional shim pieces 12-15 are provided mounted on the inner surfaces of the wall 5. The size, position and strength of these permanent magnet shims is determined empirically during design of the assembly.

Figure 4:
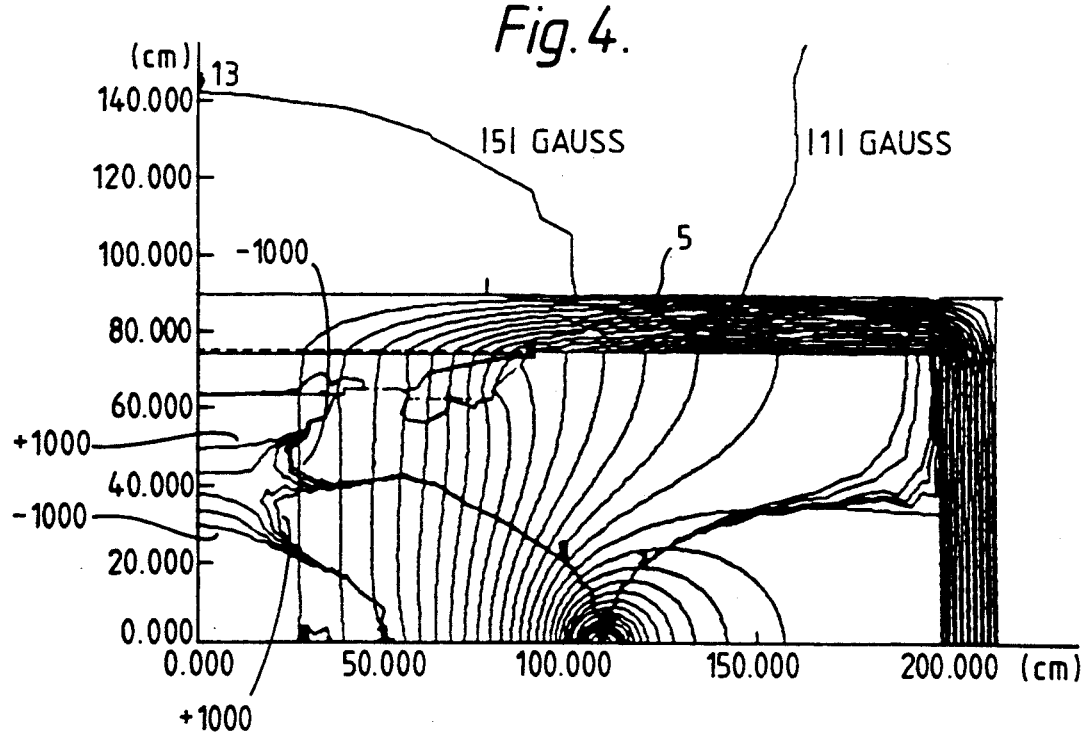
FIG. 4 illustrates the magnetic flux distribution within the FIG. 1 assembly.

FIG. 4 illustrates the flux distribution in one quadrant of an assembly similar to FIG. 1 but with three coils and with a contoured pole face on the passive side only and without side shims on the iron frame. The quadrant shown will be mirrored in the other three quadrants. For this computer simulation the effect of the shaped pole pieces 8, 9 and shims 12-15 has been ignored. In this case, the vertical axis in FIG. 4 corresponds to the axis of the coil 1 while the horizontal axis in FIG. 4 extends in the vertical direction of FIG. 1. It can be seen from FIG. 4 that the magnetic flux lines are concentrated within the iron wall 5 with very little flux leaking beyond the wall indicating that the wall acts as a shield as well as providing a return path for a majority of the magnetic flux. FIG. 4 also illustrates the 5 Gauss and 1 Gauss contours outside the wall 5 illustrating the shielding achieved considering the bone field has a magnitude of 5338.11 Gauss. The Figure also shows the location of the volume over which the field varies by ±1000 ppm and it can be seen that this lies at a radius of about 50 cm along the coil axis and at a radius of about 50 cm along the coil radius.

In use, each of the regions 10, 11 can be used for a separate MRI experiment with different patients being positioned simultaneously in each region. Typically, one patient could be made ready in one region while another patient was being imaged in another. This would mean that only one computer system would be required since it could be shared between the two regions. The size of the regions 10, 11 is such that a patient could be examined lying down or standing up or in some intermediate position such as sitting or exercising to achieve particular responses to, for example, drug therapy or diseased condition. Indeed the patient could simply walk into the appropriate region.

The symmetrical arrangement of the coil 1 and wall 5 should be noted since it is this which provides substantial symmetry of forces on the coil 1 thus avoiding the need for complex and costly support structures. Furthermore, the use of a thin coil results in a relatively small cryostat volume so that heat leakage to the system will be small and there will be a very low cryogen demand.

Figure 5:
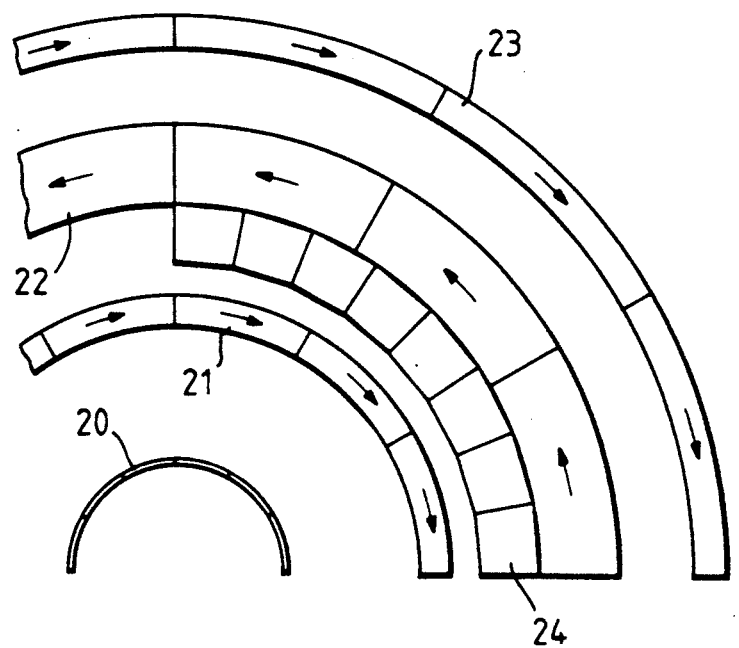
FIG. 5 illustrates a quadrant of a second assembly with the outer wall omitted.

In order to reduce the need for shims and the like, a more complex coil system can be used for the magnetic field generator. For example, a nested arrangement of counter-running coils could be employed as described, for example, in EP-A-0160350. Part of such an arrangement is illustrated in FIG. 5 in which a 4 coil system is provided comprising coils 20-23 arranged concentrically and with the relative numbers of turns in each coil being illustrated diagrammatically by the thickness in the radial direction of the coils. It will be noted from the arrows shown in FIG. 5 that the working currents in coils 21 and 23 run in the opposite direction (clockwise) to the current direction in the coil 22 (anti-clockwise). In addition, in this case, a ring shaped iron shim 24 is provided (only a quadrant of which is shown in FIG. 5) positioned between the coils 21, 22 to act as a shim and further homogenize the magnetic field in the working region. The nested coils can be arranged to result in projecting the centre of the homogeneious region out of the volume defined by the coils. This is again described in the European Specification mentioned above. Preferably, the centre of the homogeneious region can be projected into the gap or space between the coils and the remote or passive pole piece and thus optimize the region suitable for an MRI experiment.

Figure 6:
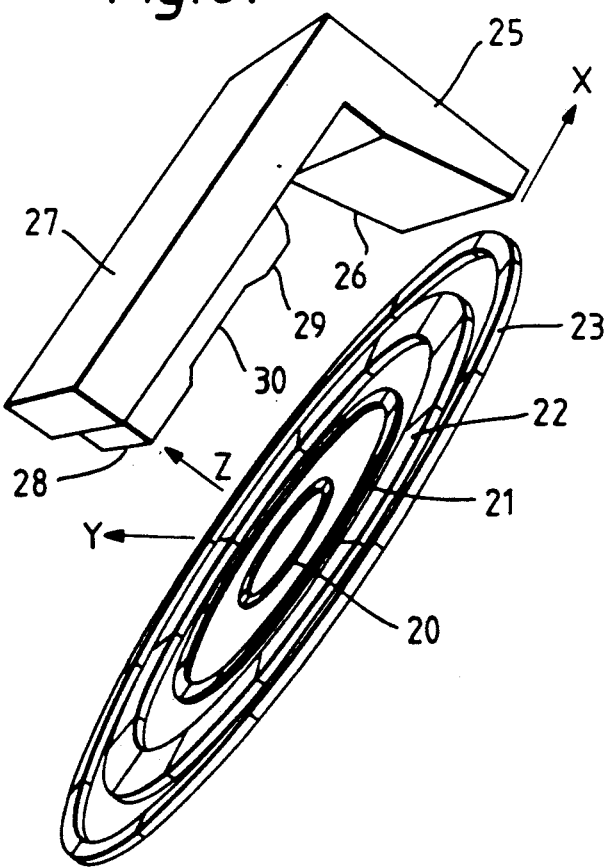
FIG. 6 illustrates the second assembly with a portion of the outer wall.

By performing the finite element method mentioned above in order to determine the form of the coils and iron wall required, it has been found that a particularly suitable geometry for the iron wall has a taper extending radially inwardly from the position of the coil to the facing wall section. This is illustrated in FIG. 6 in which the coils 20-23 of FIG. 5 are shown together with part of the iron wall. As can be seen, an upper section of the iron wall 25 has an inner surface 26 which tapers towards a vertical section 27 of the wall carrying a pole piece 28. As can be seen in FIG. 6, the pole 28 is shaped to have a generally circular, outer section 29 with, a recessed, planar central portion 30.

Figure 7A:
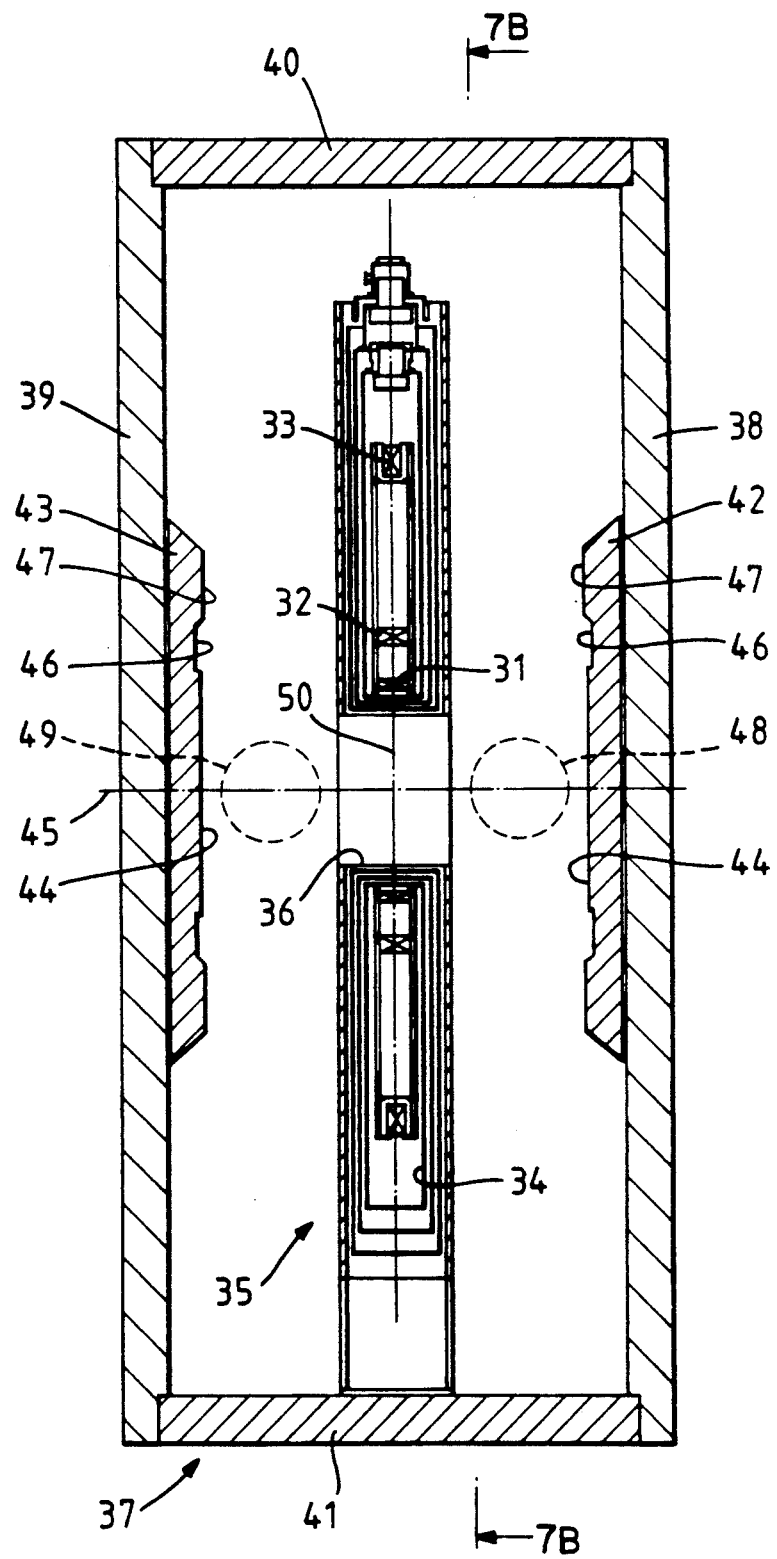
FIGS. 7A and 7B are a cross-section and view on X—X respectively of a third assembly.
Figure 7B:
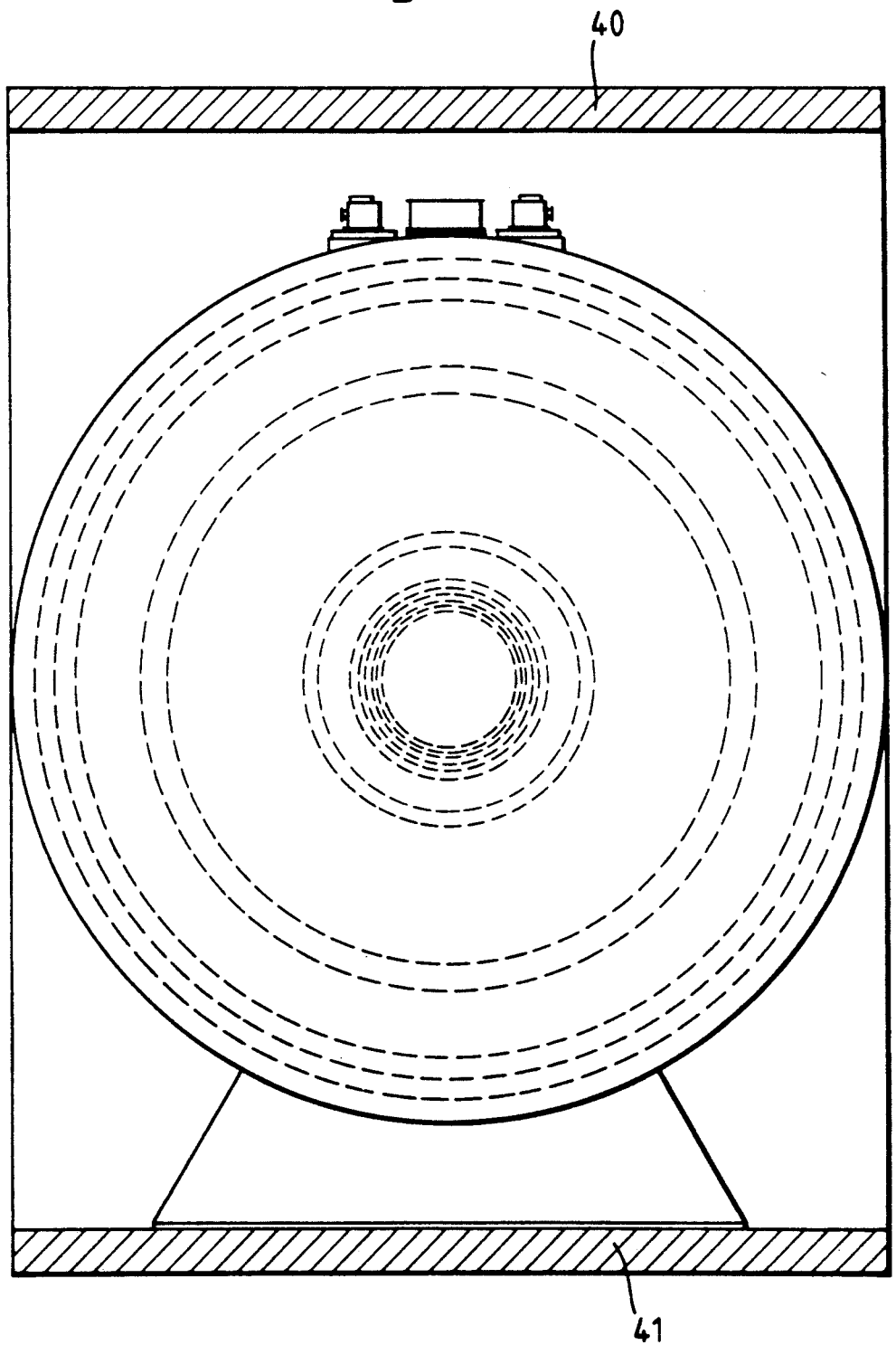

A further example is shown in FIGS. 7A and 7B. In this example, the magnetic field generator comprises a set of three coaxial, superconducting coils 31-33 mounted in respective formers within a helium vessel 34 of a cryostat 35. The Table below sets out an indication of the position of the coils 31-33 relative to an axis 45 and the number of amp-terms.

TABLE

|  | Radius Of Centre (cm) | No Of Amp Turns |
|---|---|---|
| COIL 31 | 35.5 | −4700 |
| COIL 32 | 51.5 | +30000 |
| COIL 33 | 109 | −300000 |

The cryostat 35 has a helium vessel 34, as mentioned above, and a generally conventional form including a nitrogen vessel surrounding the helium vessel and an evacuated outer casing. The cryostat defines a bore 36 having a diameter of 64.7 cm.

The cryostat 35 and coils 31-33 are positioned in an iron wall 37 which defines an open ended box having upright end walls 38,39 and generally horizontal top and bottom walls 40,41. The walls 38-41 have a thickness of about 20 cm and the walls, 38,39 have a height of about 560 cm. The overall width of the walls between the open ends (as seen in FIG. 7B) is about 420 cm while the length of the walls 40,41 is about 230 cm.

A pair of iron pole pieces 42,43 are mounted on the sides of the walls 38,39 facing the coils 31-33. It will be seen that they are contoured so as to have a raised, circular central portion 44 coaxial with the axis 45 of the coils, a radially outer recess 46 coaxial with the axis 45 and a further, circular raised portion 47 coaxial with the axis 45. The exact form of the pole faces 42,43 is determined by calculation so that the magnetic field generated by the coils 31-33 combined with the effect of the iron box and pole faces causes a substantially homogeneous field to be generated within working regions 48,49 between the coils 31-33 and respective pole pieces 42,43.

Typically, the coil configuration shown in FIG. 7A and 7B will produce magnetic fields within the working regions 48,49 having a homogeneity ±100 ppm within a sphere having a diameter of 26 cm. The working regions are centred between the plane of the coils 31–33 (indicated at 50) and the plane of the pole faces 42,43.

The gap between the side faces of the cryostat 35 and the adjacent pole pieces is about 57.5 cm and the working regions 48,49 can be arranged to be centred at the centre of these gaps.

We claim:

1. A magnetic field generating assembly comprising a magnetic field generator positioned between and spaced from opposed pole pieces which are mounted in a wall of magnetic material surrounding the magnetic field generator, the wall providing a substantially closed magnetic flux path, and the arrangement being such that forces on the generator due to magnetic flux in the wall are substantially balanced, characterized in that the magnetic field generator comprises at least two counter-running, nested coils; in that the gap between the magnetic field generator and at least one of the pole pieces is sufficient to accommodate a human body; and in that the opposed pole pieces are non-planar, the arrangement being such that when working currents flow in the coils a magnetic field is generated in a working region situated in the gap between the magnetic field generator and the at least one pole piece having a homogeneity suitable for performing a nuclear magnetic resonance experiment.

2. An assembly according to claim 1, wherein the magnetic field generator is positioned symmetrically within the wall.

3. An assembly according to claim 1, wherein the wall is made from a ferromagnetic material.

4. An assembly according to claim 1, wherein each pole piece has a generally planar central face presented towards the generator with a circular recess coaxial with the coils positioned radially outwardly of the central face.

5. An assembly according to claim 1, wherein the internal surfaces of the sides of the wall extending from the generator to the opposed walls taper towards the generator.

6. An assembly according to claim 1, further comprising one or more shim pieces mounted to internal surfaces of the wall for controlling the homogeneity of the magnetic field within the working region.

7. As assembly according to claim 2, wherein a pair of working regions are provided on each side of the generator.

8. An assembly according to claim 2, wherein the wall is made from a ferromagnetic material.

9. An assembly according to claim 2, wherein each pole piece has a generally planar central face presented towards the generator with a circular recess coaxial with the coils positioned radially outwardly of the central face.

10. An assembly according to claim 3, wherein each pole piece has a generally planar central face presented towards the generator with a circular recess coaxial with the coils positioned radially outwardly of the central face.

11. An assembly according to claim 2, wherein the internal surfaces of the sides of the wall extending from the generator to the opposed walls taper towards the generator.

12. An assembly according to claim 3, wherein the internal surfaces of the sides of the wall extending from the generator to the opposed walls taper towards the generator.

13. An assembly according to claim 4, wherein the internal surfaces of the sides of the wall extending from the generator to the opposed walls taper towards the generator.

14. An assembly according to claim 2, further comprising one or more shim pieces mounted to internal surfaces of the wall for controlling the homogeneity of the magnetic field within the working region.

15. An assembly according to claim 3, further comprising one or more shim pieces mounted to internal surfaces of the wall for controlling the homogeneity of the magnetic field within the working region.

16. An assembly according to claim 4, further comprising one or more shim pieces mounted to internal surfaces of the wall for controlling the homogeneity of the magnetic field within the working region.

17. An assembly according to claim 5, further comprising one or more shim pieces mounted to internal surfaces of the wall for controlling the homogeneity of the magnetic field within the working region.

* * * * *